United States Patent
Kang et al.

(10) Patent No.: US 10,944,067 B2
(45) Date of Patent: Mar. 9, 2021

(54) QUANTUM DOT LIGHT EMITTING DIODE AND QUANTUM DOT LIGHT EMITTING DISPLAY DEVICE INCLUDING THE SAME

(71) Applicant: LG Display Co., Ltd., Seoul (KR)

(72) Inventors: Ji-Yeon Kang, Paju-si (KR); Min-Jee Kim, Paju-si (KR); Jae-Hyun Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 2 days.

(21) Appl. No.: 16/689,919

(22) Filed: Nov. 20, 2019

(65) Prior Publication Data
US 2020/0161577 A1   May 21, 2020

(30) Foreign Application Priority Data
Nov. 21, 2018 (KR) .......................... 10-2018-0144477

(51) Int. Cl.
*H01L 51/50* (2006.01)
(52) U.S. Cl.
CPC ........ *H01L 51/5004* (2013.01); *H01L 51/502* (2013.01); *H01L 51/5064* (2013.01); *H01L 51/5092* (2013.01); *H01L 2251/552* (2013.01)
(58) Field of Classification Search
CPC ............. H01L 51/5004; H01L 27/3211; H01L 51/5056
See application file for complete search history.

(56) References Cited

U.S. PATENT DOCUMENTS

| | | | | |
|---|---|---|---|---|
| 10,418,574 | B2* | 9/2019 | Park | H01L 27/3265 |
| 10,566,564 | B2* | 2/2020 | Lee | H01L 27/3246 |
| 10,581,007 | B2* | 3/2020 | Angioni | H01L 51/5056 |
| 2017/0264613 | A1* | 9/2017 | Phillips | H04L 63/0428 |
| 2019/0097139 | A1* | 3/2019 | Lee | H01L 51/5206 |
| 2019/0157566 | A1* | 5/2019 | Ryu | C07D 495/04 |

FOREIGN PATENT DOCUMENTS

| KR | 10-2018-0077849 A | 7/2018 |
|---|---|---|
| KR | 10-1887237 B1 | 8/2018 |

\* cited by examiner

*Primary Examiner* — William Coleman
(74) *Attorney, Agent, or Firm* — Polsinelli PC

(57) ABSTRACT

A quantum dot light emitting diode comprises first and second electrodes facing each other; a hole injection layer disposed between the first electrode and the second electrode and having a first HOMO level; a first hole transporting layer disposed between the hole injection layer and the second electrode and having a second HOMO level that is lower than the first HOMO level; a second hole transporting layer disposed between the first hole transporting layer and the second electrode and having a third HOMO level that is lower than the second HOMO level; and a quantum dot light emitting layer disposed between the second hole transporting layer and the second electrode and having a fourth HOMO level that is lower than the third HOMO level, wherein a difference between the first HOMO level and the second HOMO level is greater than a difference between the second HOMO level and the third HOMO level and less than a difference between the third HOMO level and the fourth HOMO level.

20 Claims, 10 Drawing Sheets

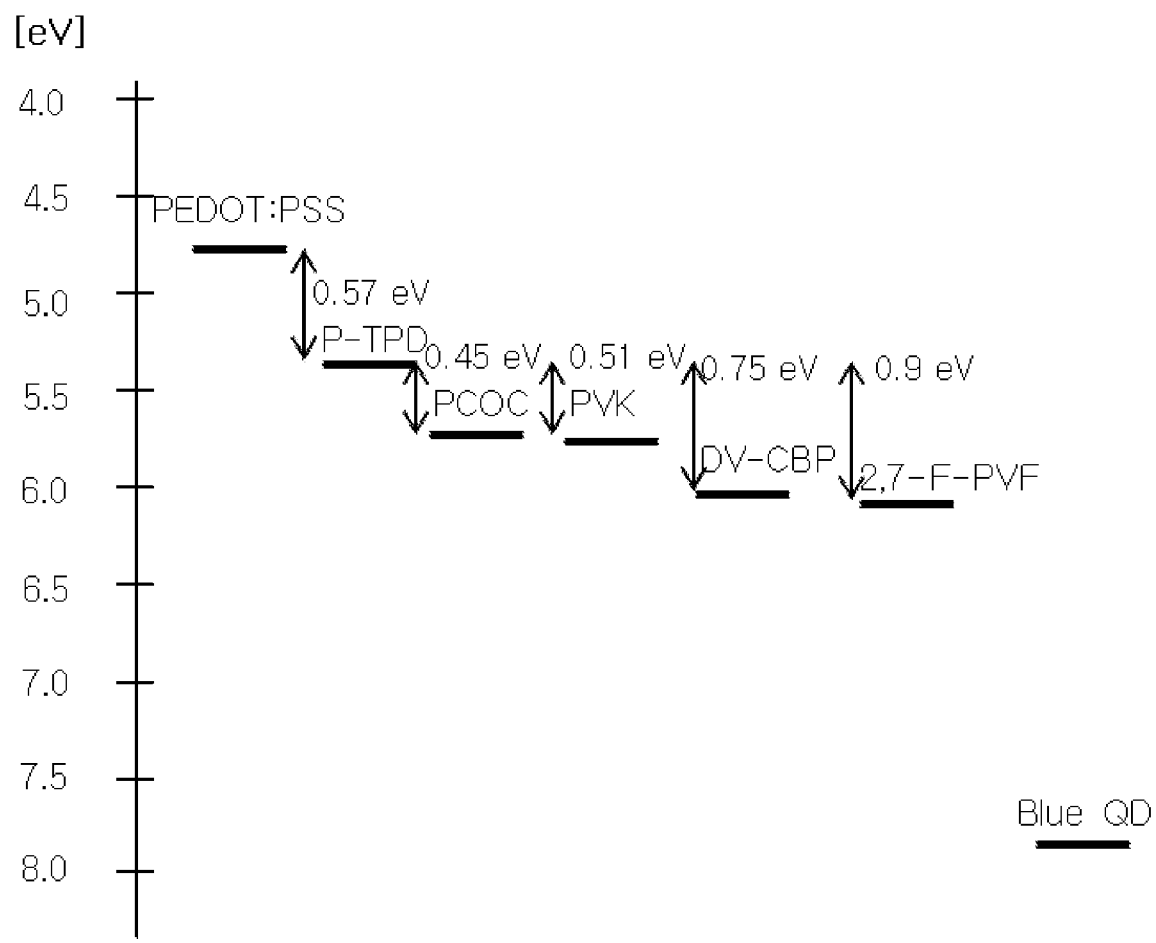

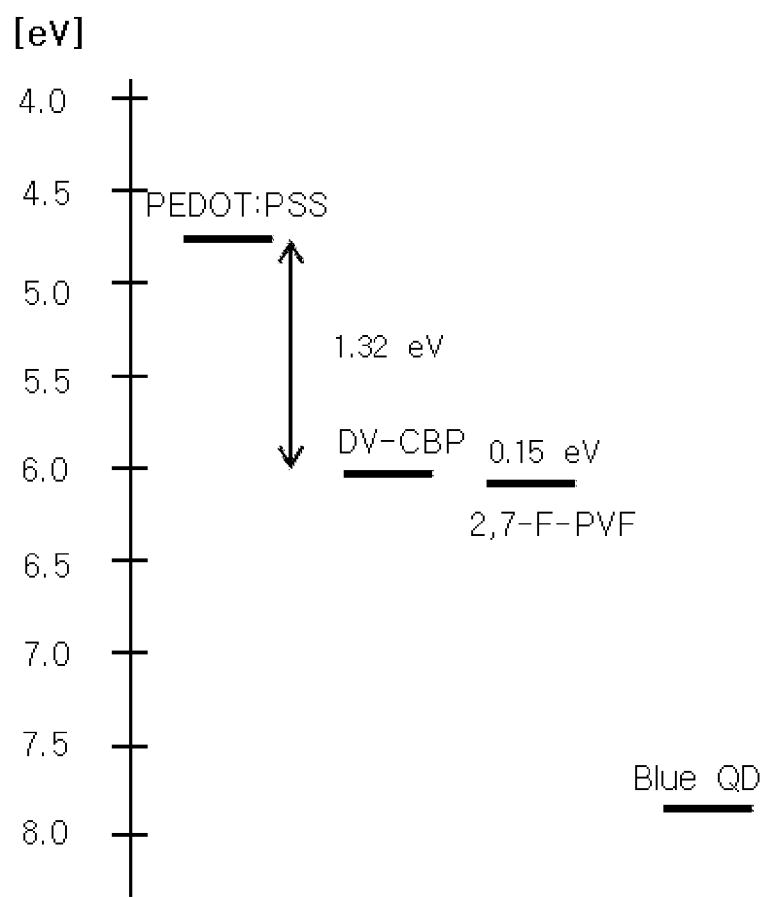

QUANTUM DOT LIGHT EMITTING DIODE AND QUANTUM DOT LIGHT EMITTING DISPLAY DEVICE INCLUDING THE SAME

CROSS REFERENCE TO RELATED APPLICATION

The present application claims the benefit of Korean Patent Application No. 10-2018-0144477 filed on Nov. 21, 2018, which is hereby incorporated by reference in its entirety.

BACKGROUND

Field of the Disclosure

The present disclosure relates to a display device, and more particularly, to a quantum dot (QD) light emitting diode including a QD light emitting layer and having advantages in driving voltage and quantum efficiency and a QD light emitting display device.

Description of the Background

As the global society enters the information age, the display field for processing and displaying a large amount of information has been rapidly developed. For example, flat panel display devices, such as a liquid crystal display (LCD) device and a plasma display panel (PDP) device and an organic light emitting display (OLED) device, have been developed.

The OLED device includes an organic light emitting diode, and the organic light emitting diode includes an electron injection electrode (cathode) and a hole injection electrode (anode) and a light emitting layer disposed therebetween. When electrons from the cathode and holes from the anode are injected into the light emitting layer, the electrons and holes are paired and then disappear to emit light from the organic light emitting diode.

The OLED device includes a red pixel, a green pixel, and a blue pixel, and red, green, and blue colors are emitted from the organic light emitting diode of each pixel to provide a color image.

Recently, use of a QD to display devices has been researched or studied.

In the QD, an electron in an unstable state transitions from a conduction band to a valence band such that light is emitted. The QD generates a strong fluorescence because the extinction coefficient is very high and the quantum efficiency (quantum yield) is excellent. In addition, since the emission wavelength is changed according to the size of the QD, by adjusting the size of the QD, it is possible to obtain entire visible light.

A light emitting diode using the QD (QD light emitting diode) includes an anode and a cathode facing each other, and a QD light emitting layer positioned between the anode and the cathode and including the QD. When holes and electrons from the anode and the cathode are injected into the QD light emitting layer, respectively, light is emitted from the QD light emitting layer.

However, in the QD light emitting diode, a charge balance is destroyed such that the luminous efficiency is decreased. For example, since the hole injection speed (rate) is slower than the electron injection speed, a problem of imbalance between holes and electrons occurs in the QD light emitting layer. Accordingly, the driving voltage of the QD light emitting diode is increased, and the quantum efficiency is decreased.

SUMMARY

Accordingly, aspects of the present disclosure are directed to a QD light emitting diode and a QD light emitting display device that substantially obviate one or more of the problems due to limitations and disadvantages of the prior art.

More specifically, the present disclosure provides a QD light emitting diode and a QD light emitting display device having improved charge balance.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a quantum dot light emitting diode comprises first and second electrodes facing each other; a hole injection layer disposed between the first electrode and the second electrode and having a first HOMO level; a first hole transporting layer disposed between the hole injection layer and the second electrode and having a second HOMO level that is lower than the first HOMO level; a second hole transporting layer disposed between the first hole transporting layer and the second electrode and having a third HOMO level that is lower than the second HOMO level; and a quantum dot light emitting layer disposed between the second hole transporting layer and the second electrode and having a fourth HOMO level that is lower than the third HOMO level, wherein a difference between the first HOMO level and the second HOMO level is greater than a difference between the second HOMO level and the third HOMO level and less than a difference between the third HOMO level and the fourth HOMO level.

In another aspect, a quantum dot light emitting display device comprises a substrate including a red pixel, a green pixel, and a blue pixel; a quantum dot light emitting diode disposed over the substrate and including first and second electrodes facing each other above the substrate, a hole injection layer disposed between the first electrode and the second electrode and having a first HOMO level, a first hole transporting layer disposed between the hole injection layer and the second electrode and having a second HOMO level that is lower than the first HOMO level, a second hole transporting layer disposed between the first hole transporting layer and the second electrode and having a third HOMO level that is lower than the second HOMO level, and a quantum dot light emitting layer disposed between the second hole transporting layer and the second electrode and having a fourth HOMO level that is lower than the third HOMO level; and a thin film transistor disposed between the substrate and the quantum dot light emitting diode and connected to the first electrode, wherein a difference between the first HOMO level and the second HOMO level is greater than a difference between the second HOMO level and the third HOMO level and less than a difference between the third HOMO level and the fourth HOMO level.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate aspects of the disclosure and together with the description serve to explain various principles.

In the drawings:

FIG. 5A to 5E are the UPS measurement graph for explaining the relationship of HOMO level in a blue pixel in the QD light emitting diode according to the first aspect of the present disclosure;

DETAILED DESCRIPTION

Reference will now be made in detail to the aspects, examples of which are illustrated in the accompanying drawings.

Figure 1:
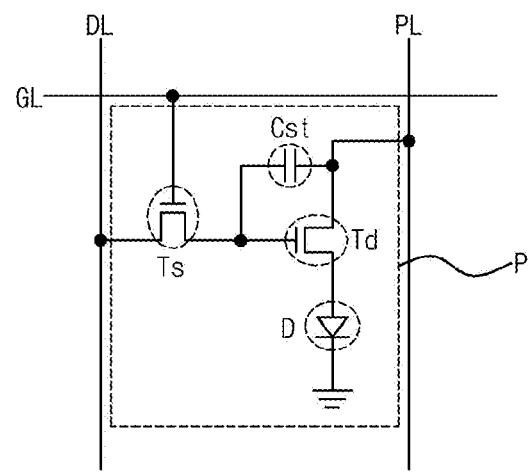
FIG. 1 is a schematic circuit diagram of a QD light emitting display device according to an aspect of the present disclosure.

FIG. 1 is a schematic circuit diagram of a QD light emitting display device according to an aspect of the present disclosure.

As illustrated in FIG. 1, in a QD light emitting display device, a gate line GL, a data line DL, and a power line PL are formed to cross each other to define a pixel P. In the pixel P, a switching thin film transistor (TFT) Ts, a driving TFT Td, a storage capacitor Cst, and a QD light emitting diode D are formed.

The switching TFT Ts is connected to the gate line GL and the data line DL, and the driving TFT Td and the storage capacitor Cst are connected between the switching TFT Ts and the power line PL. The QD light emitting diode D is connected to the driving TFT Td.

In the QD light emitting display device, when the switching TFT Ts is turned on in response to a gate signal applied to the gate line GL, a data signal applied to the data line DL passes through the switching TFT Ts and is applied to the gate electrode of the driving TFT Td and one electrode of the storage capacitor Cst.

The driving TFT Td is turned on in response to the data signal applied to the gate electrode, so that an electric current proportional to the data signal flows from the power line PL to the QD light emitting diode D through the driving TFT Td, and the QD light emitting diode D emits light with a luminance proportional to the electric current flowing through the driving TFT Td.

The storage capacitor Cst is charged with a voltage proportional to the data signal, so that the voltage of the gate electrode of the driving TFT Td is kept constant for one frame.

Accordingly, the QD light emitting display device can display desired images.

Figure 2:
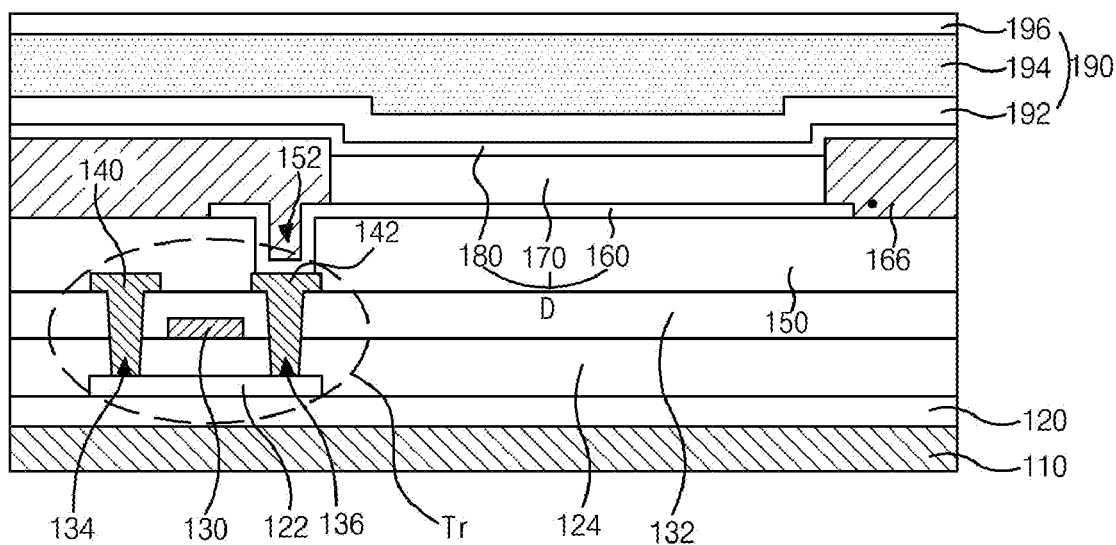
FIG. 2 is a schematic cross-sectional view of a QD light emitting display device according to an aspect of the present disclosure.

FIG. 2 is a schematic cross-sectional view of a QD light emitting display device according to an aspect of the present disclosure.

As illustrated in FIG. 2, the QD light emitting display device 100 according to the first aspect of the present disclosure includes a substrate 110, a TFT Tr disposed on the substrate 110, and a QD light emitting diode D connected to the TFT Tr.

The substrate 110 may be a glass substrate or a plastic substrate. For example, the substrate 110 may include or be made of polyimide.

A buffer layer 120 is formed on the substrate 110, and the TFT Tr is formed on the buffer layer 120. The buffer layer 120 may be omitted.

A semiconductor layer 122 is formed on the buffer layer 120. The semiconductor layer 122 may be made of an oxide semiconductor material or made of polycrystalline silicon.

When the semiconductor layer 122 is formed of the oxide semiconductor material, a light shielding pattern (not shown) may be formed under the semiconductor layer 122, and the light shielding pattern prevents light from being incident on the semiconductor layer 122, thereby preventing the semiconductor layer 122 from being degraded by light. Alternatively, the semiconductor layer 122 may be made of polycrystalline silicon. In this case, impurities may be doped into both edges of the semiconductor layer 122.

A gate insulating layer 124 made of an insulating material is formed on the semiconductor layer 122. The gate insulating layer 124 may be made of an inorganic insulating material such as silicon oxide or silicon nitride.

A gate electrode 130 made of a conductive material such as a metal is formed on the gate insulating layer 124 to correspond to a center of the semiconductor layer 122.

In FIG. 2, the gate insulating layer 124 is formed on the entire surface of the substrate 110. Alternatively, the gate insulating layer 124 may be patterned in the same shape as the gate electrode 130.

An interlayer insulating layer 132 made of an insulating material is formed on the gate electrode 130. The interlayer insulating layer 132 may be formed of an inorganic insulating material, such as silicon oxide or silicon nitride, or an organic insulating material such as benzocyclobutene or photo-acryl.

The interlayer insulating layer 132 has first and second contact holes 134 and 136 exposing both sides of the semiconductor layer 122. The first and second contact holes 134 and 136 are spaced apart from the gate electrode 130 at both sides of the gate electrode 130.

The first and second contact holes 134 and 136 are formed in the gate insulating layer 124. Alternatively, when the gate insulating layer 124 is patterned in the same shape as the gate electrode 130, the first and second contact holes 134 and 136 may be formed only in the interlayer insulating layer 132.

A source electrode 140 and a drain electrode 142 made of a conductive material such as metal are formed on the interlayer insulating layer 132.

The source electrode 140 and the drain electrode 142 are spaced apart from the gate electrode 130 and contact both sides of the semiconductor layer 122 through the first and second contact holes 134 and 136, respectively.

The semiconductor layer 122, the gate electrode 130, the source electrode 140, and the drain electrode 142 form the TFT Tr, and the TFT Tr operates as a driving element.

The TFT Tr has a coplanar structure in which the gate electrode 130, the source electrode 142, and the drain electrode 144 are disposed over the semiconductor layer 120.

Alternatively, the TFT Tr may have an inverted staggered structure. Namely, the gate electrode may be disposed under the semiconductor layer, and the source electrode and the drain electrode may be disposed over the semiconductor layer. In this case, the semiconductor layer may be made of amorphous silicon.

Although not shown, the gate line and the data line cross each other to define the pixel, and a switching element connected to the gate line and the data line is further formed. The switching element is connected to the TFT Tr as a driving element.

In addition, the power line is spaced apart in parallel with the gate line or the data line, and the storage capacitor may be further included to keep the voltage of the gate electrode of the TFT Tr, which is a driving element, constant during one frame.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is formed on the passivation layer 150. The first electrode 160 is separately formed in each pixel. The first electrode 160 may be an anode and may be made of a conductive material having a relatively high work function. For example, the first electrode 160 may be made of a transparent conductive material such as indium-tin-oxide (ITO) or indium-zinc-oxide (IZO).

Meanwhile, when the QD light emitting display device 100 of the present disclosure is a top emission type, a reflective electrode or a reflective layer may be further formed under the first electrode 160. For example, the reflective electrode or the reflective layer may be made of an aluminum-palladium-copper (APC) alloy.

In addition, a bank layer 166 is formed on the passivation layer 150 to cover edges of the first electrode 160. The bank layer 166 exposes a center of the first electrode 160 in correspondence with the pixel.

A light emitting layer 170 is formed on the first electrode 160. The light emitting layer 170 includes a QD emitting material layer (not shown) and first and second hole transporting layers (not shown) disposed between the first electrode 160 and the QD emitting material layer.

A QD may include a core and a shell surrounding the core. Each of the core and the shell may include a semiconductor compound. Each of the core and the shell may include a group II-VI compound or a group III-V compound, and each may have a single layer or a multilayer structure.

For example, the core and the shell may include one of CdSe, CdS, CdTe, ZnO, ZnSe, ZnS, ZnTe, HgSe, HgTe, CdZnSe, InP, InN, GaN, InSb, InAsP, InGaAs, GaAs, GaP, GaSb, AlP, AlN, AlAs, AlSb, CdSeTe, ZnCdSe, but are not made of the same material.

A second electrode 180 is formed over the substrate 110 on which the light emitting layer 170 is formed. The second electrode 180 is positioned at the entire surface of the display area and is made of a conductive material having a relatively low work function to serve as a cathode. For example, the second electrode 180 may be made of one of aluminum (Al), magnesium (Mg), and aluminum-magnesium alloy (AlMg).

The first electrode 160, the light emitting layer 170, and the second electrode 180 form a QD light emitting diode D.

On the second electrode 180, an encapsulation film 190 is formed to prevent external moisture from penetrating into the QD light emitting diode D. The encapsulation film 190 may have a stacked structure of the first inorganic insulating layer 192, the organic insulating layer 194, and the second inorganic insulating layer 196, but it is not limited thereto.

In addition, a polarizer (not shown) may be attached on the encapsulation film 190 to reduce external light reflection. For example, the polarizer may be a circular polarizer.

Figure 3:
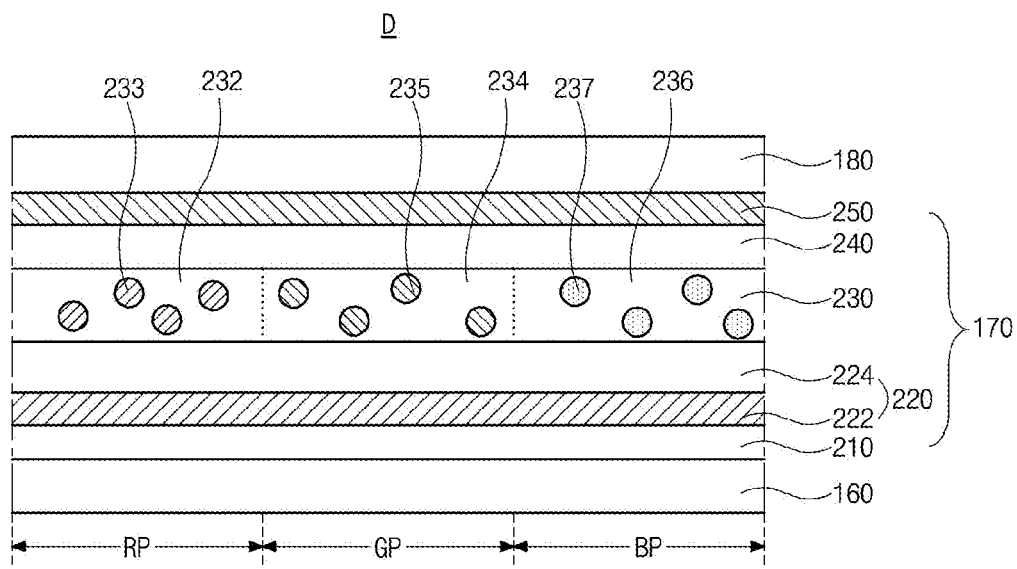
FIG. 3 is a schematic cross-sectional view of a QD light emitting diode according to a first aspect of the present disclosure.

FIG. 3 is a schematic cross-sectional view of a QD light emitting diode according to a first aspect of the present disclosure.

As illustrated in FIG. 3, each of the QD light emitting diodes D of a red pixel RP, a green pixel GP, and a blue pixel BP include the first electrode 160, the second electrode 180 facing the first electrode 160, and the light emitting layer 170 positioned between the first and second electrodes 160 and 180. The light emitting layer 170 includes a QD emitting material layer 230, a hole injection layer 210 positioned between the QD emitting material layer 230 and the first electrode 160, and a hole transporting layer 220 positioned between the QD emitting material layer 230 and the hole injection layer 210 and including first and second hole transporting layers 222 and 224. In addition, the QD light emitting diode D may further include an electron transporting layer 240 positioned between the QD emitting material layer 230 and the second electrode 180, and an electron injection layer 250 positioned between the electron transporting layer 240 and the second electrode 180. At least one of the electron transporting layer 240 and the electron injection layer 250 may be omitted.

A first emitting material layer 232 in the red pixel RP includes a first QD 233, which is a red QD, and a second emitting material layer 234 in the green pixel GP includes a second QD 235, which is a green QD, and a third emitting material layer 236 in the blue pixel BP includes a third QD 237, which is a blue QD. That is, the QD emitting material layer 230 in the red pixel RP, the green pixel GP, and the blue pixel BP is formed by different processes to have different characteristics.

Meanwhile, each of the hole injection layer 210, the hole transporting layer 220, the electron transporting layer 240, and the electron injection layer 250 included in each of the red pixel RP, the green pixel GP, and the blue pixel BP is formed by the same process and have the same characteristics. That is, each of the hole injection layer 210, the hole transporting layer 220, the electron transporting layer 240, and the electron injection layer 250 is a common layer in the red pixel RP, the green pixel GP, and the blue pixel BP.

In each of the red pixel RP, the green pixel GP, and the blue pixel BP, the highest occupied molecular orbital (HOMO) level difference (the first HOMO level difference, $\Delta H1$) between the hole injection layer 210 and the first hole transporting layer 222 is greater than the HOMO level difference (the second HOMO level difference, $\Delta H2$) between the first hole transporting layer 222 and the second hole transporting layer 224 and less than the HOMO level difference (the third HOMO level difference, $\Delta H3$) between the second hole transporting layer 224 and the QD emitting material layer 230.

Figure 4:
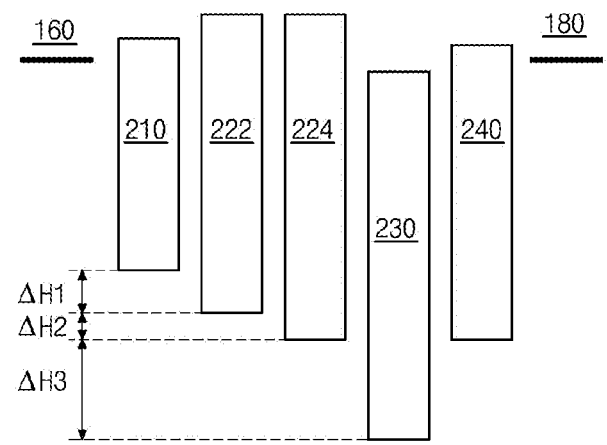
FIG. 4 is a schematic energy band diagram of a QD light emitting diode according to the first aspect of the present disclosure.

That is, referring to FIG. 4, which is a schematic energy band diagram of a QD light emitting diode according to the first aspect of the present disclosure, the hole injection layer 210 has the first HOMO level, and the first hole transporting layer 222 adjacent to the hole injection layer 210 has the second HOMO level lower than the first HOMO level. In addition, the second hole transporting layer 224 adjacent to the first hole transporting layer 222 has the third HOMO level lower than the second HOMO level, the QD emitting material layer 230 adjacent to the second hole transporting layer 224 has the fourth HOMO level lower than the third HOMO level.

The first HOMO level difference ΔH1, which is the difference between the first HOMO level and the second HOMO level, is greater than the second HOMO level difference ΔH2, which is the difference between the second HOMO level and the third HOMO level, and less than the third HOMO level difference ΔH3, which is the difference between the third HOMO level and the fourth HOMO level.

In the QD light emitting diode D, since the QD of the QD emitting material layer has a low HOMO level (valence band level), the difference in HOMO level between the hole transporting layer and the QD emitting material layer is large, and thus the hole injection characteristic (property) is degraded. Meanwhile, when using the hole transporting layer having a low HOMO level in order to reduce the HOMO level difference between the hole transporting layer and the QD emitting material layer, the difference in HOMO level between the hole injection layer and the hole transporting layer is increased, and thus the hole injection characteristics is degraded.

However, in the present disclosure, since the hole transporting layer has a double-layered structure and the HOMO level is gradually decreased, the hole injection characteristic is improved.

In addition, in the present disclosure, for improving the hole injection characteristic, the first HOMO level difference is 0.7 eV or more, and the difference between the first HOMO level difference and the second HOMO level difference is less than 0.2 eV. For example, the first HOMO level difference may be 0.7 to 1.0 eV.

Accordingly, the hole injection characteristic of the QD light emitting diode D is further improved, and the light emission efficiencies of the QD light emitting diode D and the QD light emitting display device 100 are improved.

Table 1 shows the HOMO levels of the hole transporting material used to fabricate the QD light emitting diodes.

TABLE 1

| | Full-name | Homo level (eV) |
|---|---|---|
| PVK | Poly(9-vinylcarbazole) | 5.91 |
| 2,7-F-PVF | Poly[9-sec-butyl-2,7-difluoro-9H-Carbazole] | 6.3 |
| PCOC | Poly[3-(carbazol-9-yl)-9-(3-methyloxetan-3-ylmethyl)carbazole] | 5.85 |
| DV-CBP | 4,4'-Bis[3-((4-vinylphenoxy)methyl)-9H-carbazole-9-yl]biphenyl | 6.15 |
| QUPD | N4,N4'-Bis(4-(6-((3-ethyloxetan-3-yl)methoxy)hexyloxy)phenyl)-N4,N4'-bis(4-methoxyphenyl)biphenyl-4,4'-diamine | 5.11 |
| P-TPD | Poly[N,N'-bis(4-butylphenyl)-N,N'-bisphenylbenzidine] | 5.4 |
| VNPB | N4,N4'-Di(naphthalen-1-yl)-N4,N4'-bis(4-vinylphenyl)biphenyl-4,4'-diamine | 5.58 |
| TCTA | Tris(4-carbazoyl-9-ylphenyl)amine | 5.98 |

[The QD Light Emitting Diode]

The hole injection layer (PEDOT:PSS PSS (poly(3,4-ethylenedioxythiophene) polystyrene sulfonate), 40 nm), the first hole transporting layer (20 nm), the second hole transporting layer (10 nm), the blue QD emitting material layer (ZnSe/ZnS, 30 nm), the electron transporting layer (ZnMgO, 20 nm), a cathode (Al) was sequentially laminated on an anode (ITO). The material of the first hole transporting layer is a cross-linkable material, or the first and second hole transporting layers are formed by a solution process using an orthogonal solvent with each other, thereby the second hole transporting layer is formed without damage to the first hole transporting layer.

1. Example 1 (Ex1)

The first hole transporting layer was formed using QUPD, and the second hole transporting layer was formed using VNPB.

2. Example 2 (Ex2)

The first hole transporting layer was formed using QUPD, and the second hole transporting layer was formed using PVK.

3. Example 3 (Ex3)

The first hole transporting layer was formed using QUPD, and the second hole transporting layer was formed using DV-CBP.

4. Example 4 (Ex4)

The first hole transporting layer was formed using QUPD, and the second hole transporting layer was formed using 2,7-F-PVF.

5. Comparative Example 1 (Ref1)

The first hole transporting layer having a thickness of 30 nm was formed using QUPD without the second hole transporting layer.

Figure 5A:
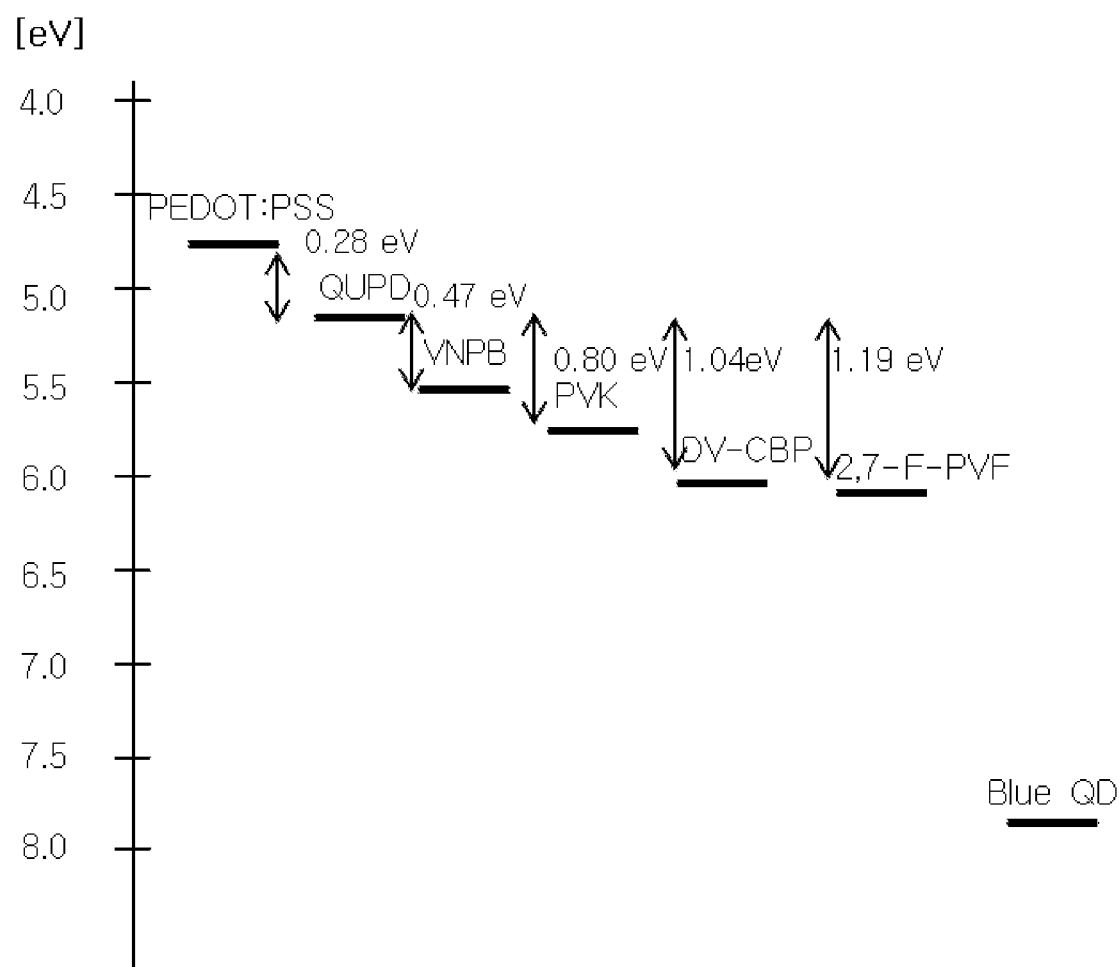

The emission characteristics of the QD light emitting diodes manufactured in Examples 1 to 4 and Comparative Example 1 were measured and listed in Table 2. In addition, in the QD light emitting diodes manufactured in Examples 1 to 4 and Comparative Example 1, HOMO levels of the hole injection layer, the first hole transporting layer, the second hole transporting layer, and the QD light emitting layer are shown in FIG. 5A.

TABLE 2

| | Volt (V) | Quantum Efficiency | Cd/m$^2$ (10 J) | CIEx | CIEy |
|---|---|---|---|---|---|
| Ref1 | 6.2 | 0.430 | 10 | 0.1641 | 0.067 |
| Ex1 | 4.8 | 0.692 | 28 | 0.1635 | 0.055 |
| Ex2 | 4.4 | 0.775 | 31 | 0.1633 | 0.055 |
| Ex3 | 4.2 | 0.803 | 35 | 0.1633 | 0.054 |
| Ex4 | 4.0 | 0.812 | 38 | 0.1630 | 0.052 |

In TABLE 2, the Volt represents the driving voltage of the QD light emitting diode, Cd/m$^2$ represents luminance, CIEx and CIEy represent color coordinate respectively.

Referring to Table 2 and FIG. 5A, by forming double-layered hole transporting layer, which includes the first hole transporting layer having the HOMO level lower than the hole injection layer and higher than the second hole transporting layer, the driving voltage of the QD light emitting diode is reduced, and the quantum efficiency and luminance are increased.

That is, when the HOMO level difference (the first HOMO level difference, ΔH1) between the hole injection layer and the first hole transporting layer is greater than the HOMO level difference (the second HOMO level difference, ΔH2) between the first hole transporting layer and the second hole transporting layer and less than the HOMO level difference (the third HOMO level difference, ΔH3) between the second hole transporting layer and the QD emitting material layer (HOMO level=7.92), the quantum efficiency of the QD light emitting diode is improved.

Meanwhile, when the HOMO level difference (the second HOMO level difference, ΔH2) between the first hole transporting layer and the second hole transporting layer is increased, the quantum efficiency of the QD light emitting diode is further increased.

[The QD Light Emitting Diode]

The hole injection layer (PEDOT:PSS, 40 nm), the first hole transporting layer (20 nm), the second hole transporting layer (10 nm), the blue QD emitting material layer (ZnSe/ZnS, 30 nm), the electron transporting layer (ZnMgO, 20 nm), a cathode (Al) was sequentially laminated on an anode (ITO).

1. Example 5 (Ex5)

The first hole transporting layer was formed using P-TPD, and the second hole transporting layer was formed using PCOC.

2. Example 6 (Ex6)

The first hole transporting layer was formed using P-TPD, and the second hole transporting layer was formed using PVK.

3. Example 7 (Ex7)

The first hole transporting layer was formed using P-TPD, and the second hole transporting layer was formed using DV-CBP.

4. Example 8 (Ex8)

The first hole transporting layer was formed using P-TPD, and the second hole transporting layer was formed using 2,7-F-PVF.

5. Comparative Example 2 (Ref2)

The first hole transporting layer having a thickness of 30 nm was formed using P-TPD without the second hole transporting layer.

The emission characteristics of the QD light emitting diodes manufactured in Examples 5 to 8 and Comparative Example 2 were measured and listed in Table 3. In addition, in the QD light emitting diodes manufactured in Examples 5 to 8 and Comparative Example 2, the HOMO levels of the hole injection layer, the first hole transporting layer, the second hole transporting layer, and the QD light emitting layer are shown in FIG. 5B.

TABLE 3

|  | Volt (V) | Quantum Efficiency | Cd/m² (10 J) | CIEx | CIEy |
|---|---|---|---|---|---|
| Ref2 | 4.6 | 1.003 | 38 | 0.1626 | 0.047 |
| Ex5 | 4.3 | 1.324 | 44 | 0.1625 | 0.046 |
| Ex6 | 4.2 | 1.330 | 45 | 0.1625 | 0.046 |
| Ex7 | 3.9 | 1.643 | 48 | 0.1624 | 0.045 |
| Ex8 | 3.4 | 1.811 | 52 | 0.1624 | 0.045 |

Referring to Table 3 and FIG. 5B, by forming double-layered hole transporting layer, which includes the first hole transporting layer having the HOMO level lower than the HOMO level (4.83 eV) of the hole injection layer and higher than the HOMO level of the second hole transporting layer, the driving voltage of the QD light emitting diode is reduced, and the quantum efficiency and luminance are increased.

That is, when the HOMO level difference (the first HOMO level difference, ΔH1) between the hole injection layer and the first hole transporting layer is greater than the HOMO level difference (the second HOMO level difference, ΔH2) between the first hole transporting layer and the second hole transporting layer, and less than the HOMO level difference (the third HOMO level difference, ΔH3) between the second hole transporting layer and the QD emitting material layer (HOMO level=7.92), the quantum efficiency of the QD light emitting diode is improved.

Meanwhile, when the HOMO level difference (the second HOMO level difference, ΔH2) between the first hole transporting layer and the second hole transporting layer is increased, the quantum efficiency of the QD light emitting diode is further increased.

In addition, compared with the QD light emitting diodes of Examples 1 to 4, the HOMO level difference (first HOMO level difference, ΔH1) between the hole injection layer and the first hole transporting layer is increased, thereby improving the quantum efficiency of the QD light emitting diode.

[The QD Light Emitting Diode]

The hole injection layer (PEDOT:PSS, 40 nm), the first hole transporting layer (20 nm), the second hole transporting layer (10 nm), the blue QD emitting material layer (ZnSe/ZnS, 30 nm), the electron transporting layer (ZnMgO, 20 nm), a cathode (Al) was sequentially laminated on an anode (ITO).

1. Example 9 (Ex9)

The first hole transporting layer was formed using VNPB, and the second hole transporting layer was formed using PCOC.

2. Example 10 (Ex0)

The first hole transporting layer was formed using VNPB, and the second hole transporting layer was formed using PVK.

3. Example 11 (Ex11)

The first hole transporting layer was formed using VNPB, and the second hole transporting layer was formed using PVK and TCTA (weight ratio=2:1, HOMO level=5.96 eV).

4. Example 12 (Ex12)

The first hole transporting layer was formed using VNPB, and the second hole transporting layer was formed using DV-CBP.

5. Example 13 (Ex13)

The first hole transporting layer was formed using VNPB, and the second hole transporting layer was formed using 2,7-F-PVF.

6. Comparative Example 3 (Ref3)

The first hole transporting layer having a thickness of 30 nm was formed using VNPB without the second hole transporting layer.

The emission characteristics of the QD light emitting diodes manufactured in Examples 9 to 13 and Comparative Example 3 were measured and listed in Table 4. In addition, in the QD light emitting diodes manufactured in Examples 9 to 13 and Comparative Example 3, the HOMO levels of the hole injection layer, the first hole transporting layer, the second hole transporting layer, and the QD light emitting layer are shown in FIG. 5C.

TABLE 4

|  | Volt (V) | Quantum Efficiency | Cd/m² (10 J) | CIEx | CIEy |
| --- | --- | --- | --- | --- | --- |
| Ref3 | 4.7 | 1.116 | 40 | 0.1623 | 0.045 |
| Ex9 | 4.5 | 1.969 | 44 | 0.1623 | 0.045 |
| Ex10 | 4.3 | 1.983 | 61 | 0.1621 | 0.045 |
| Ex11 | 4.2 | 1.990 | 70 | 0.1621 | 0.045 |
| Ex12 | 3.0 | 2.274 | 98 | 0.1620 | 0.044 |
| Ex13 | 2.8 | 2.623 | 124 | 0.1621 | 0.044 |

Figure 5C:
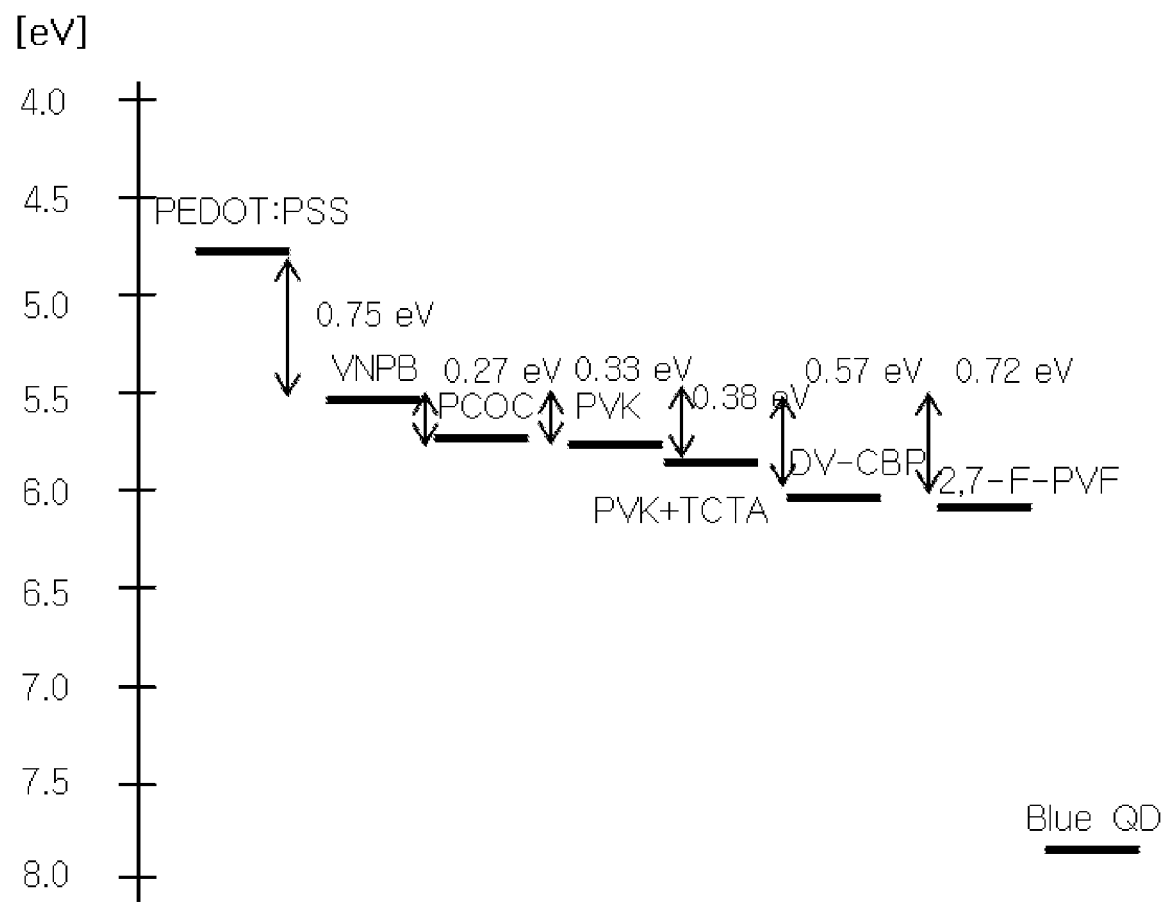

Referring to Table 4 and FIG. 5C, by forming double-layered hole transporting layer, which includes the first hole transporting layer having the HOMO level lower than the HOMO level of the hole injection layer and higher than the HOMO level of the second hole transporting layer, the driving voltage of the QD light emitting diode is reduced, and the quantum efficiency and luminance are increased.

That is, when the HOMO level difference (the first HOMO level difference, $\Delta H1$) between the hole injection layer and the first hole transporting layer is greater than the HOMO level difference (the second HOMO level difference, $\Delta H2$) between the first hole transporting layer and the second hole transporting layer, and less than the HOMO level difference (the third HOMO level difference, $\Delta H3$) between the second hole transporting layer and the QD emitting material layer (HOMO level=7.92), the quantum efficiency of the QD light emitting diode is improved.

Meanwhile, when the HOMO level difference (the second HOMO level difference, $\Delta H2$) between the first hole transporting layer and the second hole transporting layer is increased, the quantum efficiency of the QD light emitting diode is further increased.

In addition, compared with the QD light emitting diodes of Examples 1 to 8, the HOMO level difference (first HOMO level difference, $\Delta H1$) between the hole injection layer and the first hole transporting layer is increased, thereby improving the quantum efficiency of the QD light emitting diode.

In addition, when the difference between the first HOMO level difference $\Delta H1$ and the second HOMO level difference $\Delta H2$ is less than 0.2 eV, the driving voltage of the QD light emitting diode is minimized and the quantum efficiency and luminance are maximized.

For example, the first hole transporting layer may include or be made of VNPB, and the second hole transporting layer may be include or made of DV-CBP or 2,7-F-PVF.

[The QD Light Emitting Diode]

The hole injection layer (PEDOT:PSS, 40 nm), the first hole transporting layer (20 nm), the second hole transporting layer (10 nm), the blue QD emitting material layer (ZnSe/ZnS, 30 nm), the electron transporting layer (ZnMgO, 20 nm), a cathode (Al) was sequentially laminated on an anode (ITO).

1. Example 14 (Ex14)

The first hole transporting layer was formed using PVK, and the second hole transporting layer was formed using DV-CBP.

2. Example 15 (Ex15)

The first hole transporting layer was formed using PVK, and the second hole transporting layer was formed using 2,7-F-PVF.

3. Example 16 (Ex16)

The first hole transporting layer was formed using DV-CBP, and the second hole transporting layer was formed using 2,7-F-PVF.

4. Comparative Example 4 (Ref4)

The first hole transporting layer having a thickness of 30 nm was formed using PVK without the second hole transporting layer.

5. Comparative Example 5 (Ref5)

The first hole transporting layer having a thickness of 30 nm was formed using DV-CBP without the second hole transporting layer.

The emission characteristics of the QD light emitting diodes manufactured in Examples 14 to 16 and Comparative Examples 4 to 5 were measured and listed in Table 5. In addition, in the QD light emitting diodes manufactured in Examples 14 to 15 and Comparative Example 4, the HOMO levels of the hole injection layer, the first hole transporting layer, the second hole transporting layer, and the QD light emitting layer are shown in FIG. 5D, and in the QD light emitting diodes manufactured in Example 16 and Comparative Example 5, the HOMO levels of the hole injection layer, the first hole transporting layer, the second hole transporting layer, and the QD light emitting layer are shown in FIG. 5E.

TABLE 5

|  | Volt (V) | Quantum Efficiency | Cd/m² (10 J) | CIEx | CIEy |
| --- | --- | --- | --- | --- | --- |
| Ref4 | 5.8 | 1.164 | 30 | 0.1644 | 0.048 |
| Ref5 | 6.0 | 0.905 | 22 | 0.1646 | 0.049 |
| Ex14 | 5.0 | 1.278 | 42 | 0.1638 | 0.047 |
| Ex15 | 4.8 | 1.349 | 44 | 0.1630 | 0.042 |
| Ex16 | 5.9 | 0.994 | 25 | 0.1646 | 0.048 |

Figure 5D:
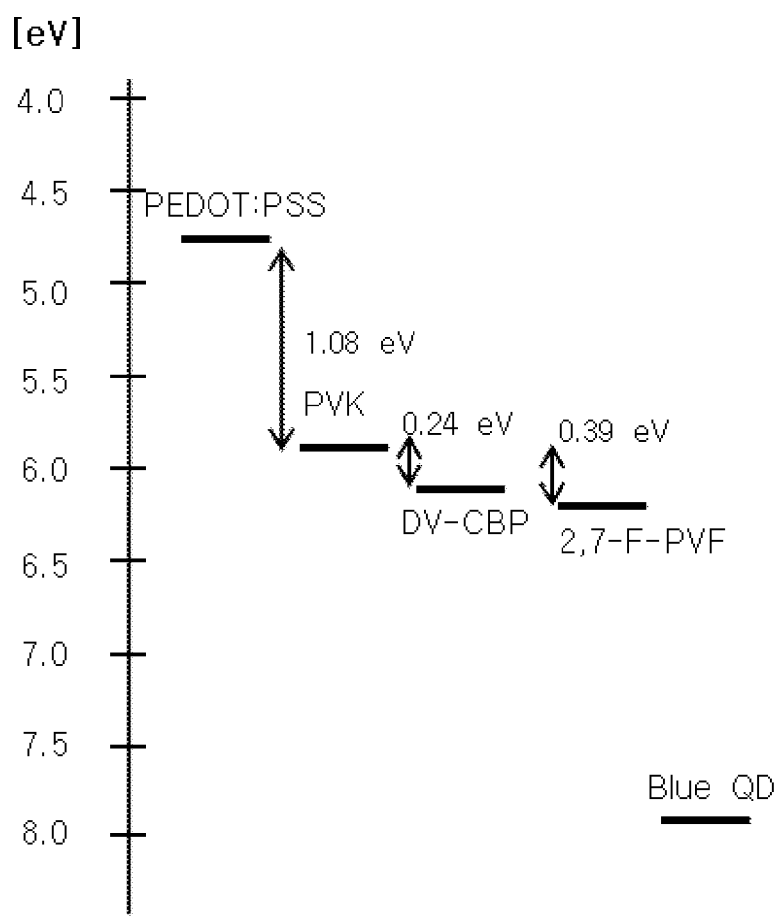

Referring to Table 5, FIGS. 5D and 5E, by forming double-layered hole transporting layer, which includes the first hole transporting layer having the HOMO level lower than the HOMO level of the hole injection layer and higher than the HOMO level of the second hole transporting layer, the driving voltage of the QD light emitting diode is reduced, and the quantum efficiency and luminance are increased.

That is, when the HOMO level difference (the first HOMO level difference, ΔH1) between the hole injection layer and the first hole transporting layer is greater than the HOMO level difference (the second HOMO level difference, ΔH2) between the first hole transporting layer and the second hole transporting layer, and less than the HOMO level difference (the third HOMO level difference, ΔH3) between the second hole transporting layer and the QD emitting material layer (HOMO level=7.92), the quantum efficiency of the QD light emitting diode is improved.

However, when the HOMO level difference (first HOMO level difference, ΔH1) between the hole injection layer and the first hole transporting layer is too large, the quantum efficiency of the QD light emitting diode is reduced.

Therefore, in the QD light emitting diode of the present disclosure, when the HOMO level difference (first HOMO level difference, ΔH1) between the hole injection layer and the first hole transporting layer is 0.7 to 1.0 eV, the driving voltage of the QD light emitting diode is minimized and the quantum efficiency is maximized.

However, the HOMO level (7.45 eV) of the red QD and the HOMO level (7.58 eV) of the green QD are higher than the HOMO level (7.92 eV) of the blue QD. Accordingly, as described above, when the first HOMO level difference is 0.7 to 1.0 eV and the difference between the first HOMO level difference and the second HOMO level difference is less than 0.2 eV, the quantum efficiency in red pixels and green pixels, especially red pixels, is lowered.

Figure 6:
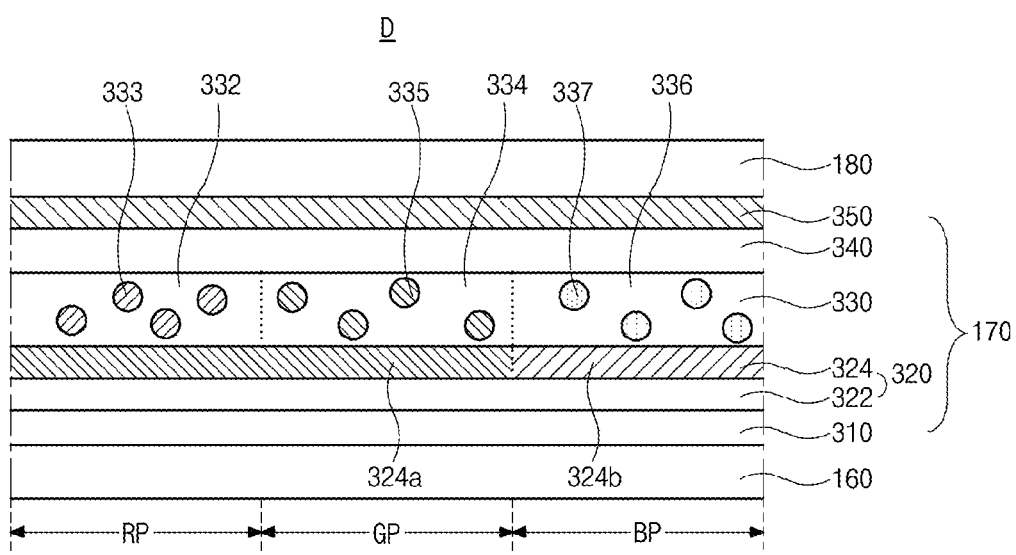
FIG. 6 is a schematic cross-sectional view of a QD light emitting diode according to a second aspect of the present disclosure.

FIG. 6 is a schematic cross-sectional view of a QD light emitting diode according to a second aspect of the present disclosure.

As illustrated in FIG. 6, each of the QD light emitting diodes D in a red pixel RP, a green pixel GP, and a blue pixel BP include the first electrode 160, the second electrode 180 facing the first electrode 160, and the light emitting layer 170 positioned between the first and second electrodes 160 and 180. The light emitting layer 170 includes a QD emitting material layer 330, a hole injection layer 310 positioned between the QD emitting material layer 330 and the first electrode 160, and a hole transporting layer 320 positioned between the QD emitting material layer 330 and the hole injection layer 310 and including first and second hole transporting layers 322 and 324.

The second hole transporting layer 324 includes a first hole transporting pattern 324a corresponding to the red pixel RP and the green pixel GP, and a second hole transporting pattern 324b corresponding to the blue pixel BP.

That is, the first hole transporting layers 322 is a common layer in the red pixel RP, the green pixel GP and the blue pixel BP. On the other hand, in the second hole transporting layer 324, the first hole transporting pattern 324a corresponding to the red pixel RP and the green pixel GP and the second hole transporting pattern 324b corresponding to the blue pixel BP include or are made of different materials.

In addition, the QD light emitting diode D may further include an electron transporting layer 340 positioned between the QD emitting material layer 330 and the second electrode 180, and an electron injection layer 350 positioned between the electron transporting layer 340 and the second electrode 180. At least one of the electron transporting layer 340 and the electron injection layer 350 may be omitted.

A first emitting material layer 332 in the red pixel RP includes a first QD 333, which is a red QD, a second emitting material layer 334 in the green pixel GP includes a second QD 335, which is a green QD, a third emitting material layer 336 in the blue pixel BP includes a third QD 337, which is a blue QD. That is, the QD emitting material layer 330 in the red pixel RP, the green pixel GP, and the blue pixel BP are formed by different processes to have different characteristics.

In each of the red pixel RP, the green pixel GP, and the blue pixel BP, the highest occupied molecular orbital (HOMO) level difference (the first HOMO level difference, ΔH1) between the hole injection layer 310 and the first hole transporting layer 322 is greater than the HOMO level difference (the second HOMO level difference, ΔH2) between the first hole transporting layer 322 and the second hole transporting pattern 324b of the second hole transporting layer 324 and less than the HOMO level difference (the third HOMO level difference, ΔH3) between the second hole transporting pattern 324b of the second hole transporting layer 324 and the QD emitting material layer 330.

In the blue pixel BP, the first HOMO level difference is 0.7 eV or more, and the difference between the first HOMO level difference and the second HOMO level difference is less than 0.2 eV. For example, the first HOMO level difference may be 0.7 to 1.0 eV.

Meanwhile, in at least one of the red pixel RP and the green pixel GP, the first HOMO level difference is 0.7 eV or more, and the difference between the first HOMO level difference and the second HOMO level difference is 0.2 to 0.4 eV. For example, the first HOMO level difference may be 0.7 to 1.0 eV, and the difference between the first HOMO level difference and the second HOMO level difference may be 0.3 to 0.4 eV. The difference between the first HOMO level difference and the second HOMO level difference may be 0.38 eV.

Accordingly, the hole injection characteristics in the red pixel RP, the green pixel GP, and the blue pixel BP are improved, and the luminous efficiency of the QD light emitting diode D and the QD light emitting display device 100 are optimized.

That is, when the difference between the first HOMO level difference and the second HOMO level difference in the red pixel RP and the green pixel GP is less than 0.2 eV, the difference in HOMO levels between the first hole transporting pattern 324a and the first and second QD emitting material layers 332 and 334 becomes too large. Accordingly, the balance of hole injection in the red pixel RP, the green pixel GP, and the blue pixel BP is degraded.

However, in the present disclosure, when the difference between the first HOMO level difference and the second HOMO level difference in the blue pixel BP is less than 0.2 eV and the difference between the first HOMO level difference and the second HOMO level difference in the red pixel RP and the green pixel GP is 0.2 to 0.4 eV, the balance of hole injection in the red pixel RP, the green pixel GP, and the blue pixel BP is improved.

In addition, in the present disclosure, the difference between the HOMO level (7.45 eV) of the first QD 333 in the red pixel RP and the HOMO level (7.58 eV) of the second QD 335 in the green pixel GP is less than the difference between the HOMO level of the second QD 335 in the green pixel GP and the HOMO level (7.92 eV) of the third QD 337 in the blue pixel BP. Accordingly, when the second hole transporting layer 324 in the red pixel RP and the green pixel GP is made of the same material, the manufacturing process is simplified with improving the balance of hole injection.

[The QD Light Emitting Diode]

The hole injection layer (PEDOT:PSS, 40 nm), the first hole transporting layer (20 nm), the second hole transporting layer (10 nm), the red QD emitting material layer (InP/ZnSe/

ZnS, 30 nm), the electron transporting layer (ZnMgO, 20 nm), a cathode (Al) was sequentially laminated on an anode (ITO).

1. Example 17 (Ex17)

The first hole transporting layer was formed using VNPB, and the second hole transporting layer was formed using PCOC.

2. Example 18 (Ex18)

The first hole transporting layer was formed using VNPB, and the second hole transporting layer was formed using PVK.

3. Example 19 (Ex19)

The first hole transporting layer was formed using VNPB, and the second hole transporting layer was formed using PVK and TCTA (weight ratio=2:1).

4. Example 20 (Ex20)

The first hole transporting layer was formed using VNPB, and the second hole transporting layer was formed using DV-CBP.

5. Example 21 (Ex21)

The first hole transporting layer was formed using VNPB, and the second hole transporting layer was formed using 2,7-F-PVF.

The emission characteristics of the QD light emitting diodes manufactured in Examples 17 to 21 were measured and listed in Table 6. In addition, in the QD light emitting diodes manufactured in Examples 17 to 21, the HOMO levels of the hole injection layer, the first hole transporting layer, the second hole transporting layer, and the QD light emitting layer are shown in FIG. 7.

TABLE 6

|  | Volt (V) | Quantum Efficiency | Cd/m² (10 J) | CIEx | CIEy |
| --- | --- | --- | --- | --- | --- |
| Ex17 | 4.5 | 3.0011 | 270.1 | 0.6852 | 0.3097 |
| Ex18 | 4.3 | 3.2024 | 279.6 | 0.6852 | 0.3097 |
| Ex19 | 4.1 | 4.2892 | 360 | 0.6854 | 0.3097 |
| Ex20 | 4.1 | 3.5168 | 316.3 | 0.6854 | 0.3097 |
| Ex21 | 4.2 | 3.3285 | 289.5 | 0.6851 | 0.3095 |

Figure 7:
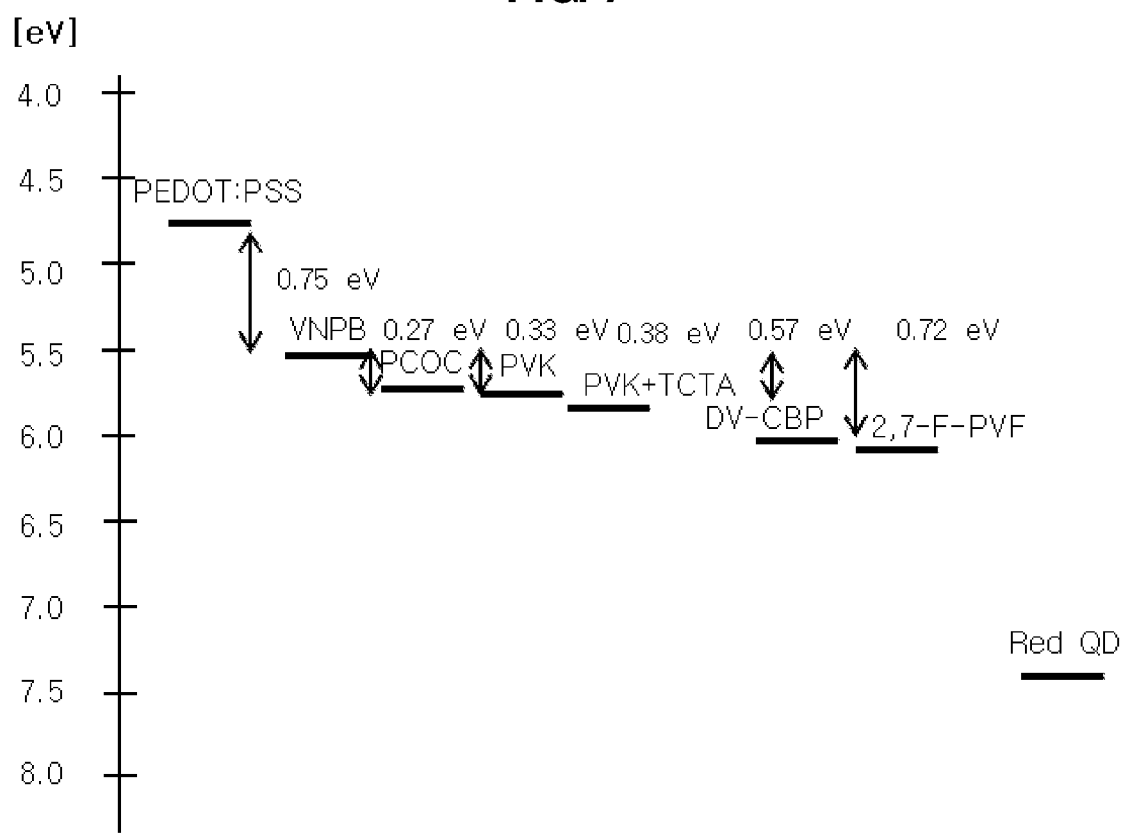
FIG. 7 is the UPS measurement graph for explaining the relationship of HOMO level in a red pixel in the QD light emitting diode according to the second aspect of the present disclosure.

Referring to Table 6 and FIG. 7, in the QD light emitting diode of Example 19, wherein the first HOMO level difference is 0.7 eV or more, and the difference between the first HOMO level difference and the second HOMO level difference is 0.2 to 0.4 eV, the quantum efficiency and the luminance are improved.

[The QD Light Emitting Diode]

The hole injection layer (PEDOT:PSS, 40 nm), the first hole transporting layer (20 nm), the second hole transporting layer (10 nm), the green QD emitting material layer (InP/ZnSe/ZnS, 30 nm), the electron transporting layer (ZnMgO, 20 nm), a cathode (Al) was sequentially laminated on an anode (ITO).

1. Example 22 (Ex22)

The first hole transporting layer was formed using VNPB, and the second hole transporting layer was formed using PCOC.

2. Example 23 (Ex23)

The first hole transporting layer was formed using VNPB, and the second hole transporting layer was formed using PVK.

3. Example 24 (Ex24)

The first hole transporting layer was formed using VNPB, and the second hole transporting layer was formed using PVK and TCTA (weight ratio=2:1).

4. Example 25 (Ex25)

The first hole transporting layer was formed using VNPB, and the second hole transporting layer was formed using DV-CBP.

5. Example 26 (Ex26)

The first hole transporting layer was formed using VNPB, and the second hole transporting layer was formed using 2,7-F-PVF.

6. Comparative Example 6 (Ref6)

The first hole transporting layer having a thickness of 30 nm was formed using VNPB without the second hole transporting layer.

The emission characteristics of the QD light emitting diodes manufactured in Examples 22 to 26 and Comparative Examples 6 were measured and listed in Table 7. In addition, in the QD light emitting diodes manufactured in Examples 22 to 26 and Comparative Example 6, the HOMO levels of the hole injection layer, the first hole transporting layer, the second hole transporting layer, and the QD light emitting layer are shown in FIG. 8.

TABLE 7

|  | Volt (V) | Quantum Efficiency | Cd/m² (10 J) | CIEx | CIEy |
| --- | --- | --- | --- | --- | --- |
| Ref6 | 3.3 | 2.28 | 999 | 0.249 | 0.646 |
| Ex22 | 3.2 | 2.31 | 1085 | 0.248 | 0.645 |
| Ex23 | 3.0 | 2.79 | 1131 | 0.245 | 0.643 |
| Ex24 | 3.0 | 2.86 | 1143 | 0.245 | 0.643 |
| Ex25 | 3.0 | 2.80 | 1133 | 0.245 | 0.643 |
| Ex26 | 3.0 | 2.80 | 1131 | 0.245 | 0.643 |

Figure 8:
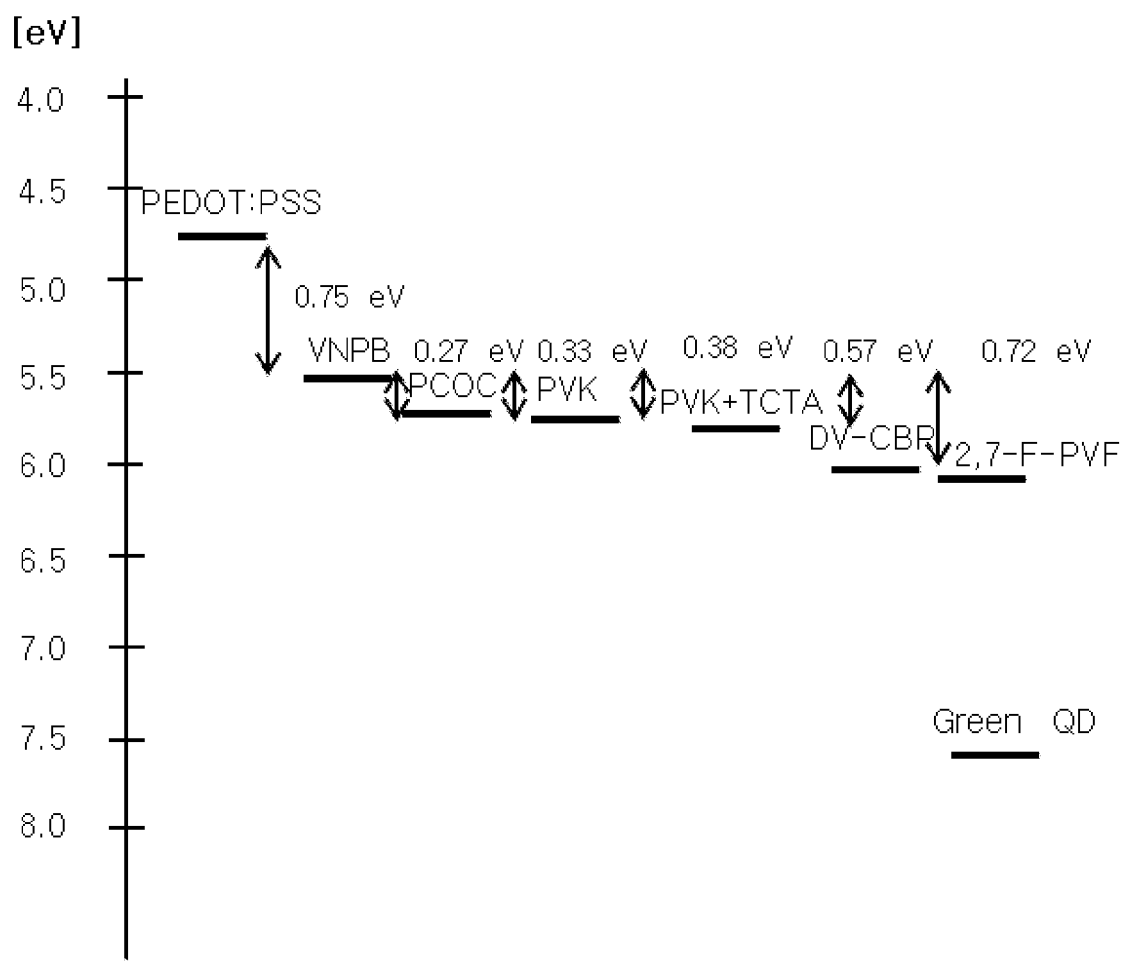
FIG. 8 is the UPS measurement graph for explaining the relationship of HOMO level in a green pixel in the QD light emitting diode according to the second aspect of the present disclosure.

Referring to Table 7 and FIG. 8, in the QD light emitting diode of Example 24, wherein the first HOMO level difference is 0.7 eV or more, and the difference between the first HOMO level difference and the second HOMO level difference is 0.2 to 0.4 eV, the quantum efficiency and the luminance are improved.

That is, in the red, green, and blue pixels, the first hole transporting layer may include or be made of VNPB. Meanwhile, the second hole transporting layer in the red and green pixels may include or be made of a mixture of PVK and TCTA (weight ratio=2:1), and the second hole transporting layer in the blue pixel may include or be made of DV-CBP or 2,7-F-PVF.

It will be apparent to those skilled in the art that various modifications and variations can be made in the QD light emitting diode and the QD light emitting display device including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A quantum dot emitting diode, comprising:
first and second electrodes facing each other;
a hole injection layer disposed between the first electrode and the second electrode and having a first HOMO level;
a first hole transporting layer disposed between the hole injection layer and the second electrode and having a second HOMO level that is lower than the first HOMO level;
a second hole transporting layer disposed between the first hole transporting layer and the second electrode and having a third HOMO level that is lower than the second HOMO level; and
a quantum dot light emitting layer disposed between the second hole transporting layer and the second electrode and having a fourth HOMO level that is lower than the third HOMO level,
wherein a difference between the first HOMO level and the second HOMO level is greater than a difference between the second HOMO level and the third HOMO level and less than a difference between the third HOMO level and the fourth HOMO level.

2. The quantum dot emitting diode according to claim 1, wherein the difference between the first HOMO level and the second HOMO level is 0.7 eV or more.

3. The quantum dot emitting diode according to claim 1, wherein, in a blue pixel, a difference between the difference between the first HOMO level and the second HOMO level and the difference between the second HOMO level and the third HOMO level is less than 0.2 eV.

4. The quantum dot emitting diode according to claim 1, wherein, in red and green pixels, a difference between the difference between the first HOMO level and the second HOMO level and the difference between the second HOMO level and the third HOMO level is less than 0.2 eV.

5. The quantum dot emitting diode according to claim 3, wherein, in at least one of red and green pixels, a difference between the difference between the first HOMO level and the second HOMO level and the difference between the second HOMO level and the third HOMO level is 0.2 to 0.4 eV.

6. The quantum dot emitting diode according to claim 3, wherein, in red and green pixels, a difference between the difference between the first HOMO level and the second HOMO level and the difference between the second HOMO level and the third HOMO level is less than 0.2 eV.

7. The quantum dot emitting diode according to claim 5, wherein a difference between the fourth HOMO level in the red pixel and the fourth HOMO level in the green pixel is less than a difference between the fourth HOMO level in the green pixel and the fourth HOMO level in the blue pixel.

8. The quantum dot emitting diode according to claim 5, wherein the second hole transporting layer in the red and green pixels includes a first hole transporting material, and the second hole transporting layer in the blue pixel includes a second hole transporting material.

9. The quantum dot emitting diode according to claim 6, wherein the second hole transporting layer in the red pixel, the green pixel and the blue pixel includes a same material.

10. A quantum dot light emitting display device, comprising:
a substrate including a red pixel, a green pixel, and a blue pixel;
a quantum dot light emitting diode disposed over the substrate and including:
first and second electrodes facing each other above the substrate;
a hole injection layer disposed between the first electrode and the second electrode and having a first HOMO level;
a first hole transporting layer disposed between the hole injection layer and the second electrode and having a second HOMO level that is lower than the first HOMO level;
a second hole transporting layer disposed between the first hole transporting layer and the second electrode and having a third HOMO level that is lower than the second HOMO level; and
a quantum dot light emitting layer disposed between the second hole transporting layer and the second electrode and having a fourth HOMO level that is lower than the third HOMO level; and
a thin film transistor disposed between the substrate and the quantum dot light emitting diode and connected to the first electrode,
wherein a difference between the first HOMO level and the second HOMO level is greater than a difference between the second HOMO level and the third HOMO level and less than a difference between the third HOMO level and the fourth HOMO level.

11. The quantum dot light emitting display device according to claim 10, wherein the difference between the first HOMO level and the second HOMO level is 0.7 eV or more.

12. The quantum dot light emitting display device according to claim 10, wherein, in the blue pixel, a difference between the difference between the first HOMO level and the second HOMO level and the difference between the second HOMO level and the third HOMO level is less than 0.2 eV.

13. The quantum dot light emitting display device according to claim 10, wherein, in the red and green pixels, a difference between the difference between the first HOMO level and the second HOMO level and the difference between the second HOMO level and the third HOMO level is less than 0.2 eV.

14. The quantum dot light emitting display device according to claim 12, wherein, in at least one of the red and green pixels, a difference between the difference between the first HOMO level and the second HOMO level and the difference between the second HOMO level and the third HOMO level is 0.2 to 0.4 eV.

15. The quantum dot light emitting display device according to claim 12, wherein, in the red and green pixels, a difference between the difference between the first HOMO level and the second HOMO level and the difference between the second HOMO level and the third HOMO level is less than 0.2 eV.

16. The quantum dot light emitting display device according to claim 14, wherein a difference between the fourth HOMO level in the red pixel and the fourth HOMO level in the green pixel is less than the difference between the fourth HOMO level in the green pixel and the fourth HOMO level in the blue pixel.

17. The quantum dot light emitting display device according to claim 14, the second hole transporting layer in the red and green pixels includes a first hole transporting material, and the second hole transporting layer in the blue pixel includes a second hole transporting material.

18. The quantum dot light emitting display device according to claim 15, wherein the second hole transporting layer in the red pixel, the green pixel, and the blue pixel includes a same material.

19. A quantum dot emitting diode, comprising:
first and second electrodes facing each other;
a hole injection layer disposed between the first electrode and the second electrode and having a first HOMO level;
a first hole transporting layer disposed between the hole injection layer and the second electrode and having a second HOMO level that is lower than the first HOMO level;
a second hole transporting layer disposed between the first hole transporting layer and the second electrode and having a third HOMO level that is lower than the second HOMO level; and
a quantum dot light emitting layer disposed between the second hole transporting layer and the second electrode and having a fourth HOMO level that is lower than the third HOMO level,
wherein a difference between the first HOMO level and the second HOMO level is 0.7 eV or more, and
wherein, in a blue pixel, a difference between the difference between the first HOMO level and the second HOMO level and a difference between the second HOMO level and the third HOMO level is less than 0.2 eV.

20. The quantum dot emitting diode according to claim 19, wherein, in at least one of red and green pixels, a difference between the difference between the first HOMO level and the second HOMO level and the difference between the second HOMO level and the third HOMO level is 0.2 to 0.4 eV.

* * * * *